METHOD OF FABRICATING SEMICONDUCTOR DEVICES

Filed Dec. 30, 1963 2 Sheets-Sheet 1

INVENTOR
GEORGE T. ELIE
BY
W. S. Hill
AGENT

INVENTOR
GEORGE T. ELIE
BY
W. S. Hill
AGENT

United States Patent Office 3,264,707

Patented August 9, 1966

3,264,707

METHOD OF FABRICATING SEMICONDUCTOR DEVICES

George T. Elie, Bound Brook, N.J., assignor to Radio Corporation of America, a corporation of Delaware Filed Dec. 30, 1963, Ser. No. 334,138
3 Claims. (Cl. 29—25.3)

This invention relates to improved semiconductor devices and improved methods of making such devices. More particularly, it relates to improved methods of fabricating improved III–V compound semiconductor devices, that is, devices composed of a material selected from the group consisting of the phosphides, arsenides, and antimonides of aluminum, gallium, and indium.

Various types of semiconductor devices containing at least one rectifying barrier or p-n junction have been fabricated from III–V semiconductor compounds, including for example diodes, transistors, varactor diodes, and tunnel diodes. One type of semiconductor junction device which may be fabricated from a III–V semiconductor body is the solar cell, which has been used to convert impinging solar radiation into electrical energy to serve as portable power supplies. The solar cell usually consists of a wafer or layer of given conductivity type crystalline semiconductor material. On one major face of the wafer, a thin surface layer of opposite conductivity type is formed, so that a rectifying barrier or p-n junction exists a short distance below the surface of the major wafer face. One electrical connection or lead is made to the given conductivity bulk of the wafer and another electrical connection is made to the thin opposite-type surface layer on the wafer. A load is connected between the two lead wires. When a sufficiently energetic quantum of radiant energy impinges on the surface layer of the device, it is absorbed by the crystal lattice of the semiconductor, and introduces sufficient energy into the crystal lattice to break valence bonds between the semiconductor atoms, and thus liberates electron-hole pairs. Only those photons having energy equal to, or greater than, the energy gap of the semiconductor liberate electron-hole pairs in the semiconductor lattice. The potential gradient of the p-n junction causes the electrons and holes of each pair to separate and diffuse in opposite directions across the junction, the electrons moving to the N-type region and the holes moving to the P-type region, thereby generating a flow of electric charges. A flow of current (conventional) is thus obtained from the N-type portion of the device, through the load, to the P-type portion of the device. It is desirable to obtain maximum efficiency for the conversion of solar energy in such devices, i.e., to maximize the ratio of output electric power to input solar power.

When solar cells are fabricated from a III–V semiconductor compound such as gallium arsenide, they are much more resistant to the damaging effect of energetic radiation and atomic particles than silicon solar cells. However, it has not hitherto been possible to fabricate gallium arsenide solar cells which are as efficient as silicon solar cells in the conversion of solar radiant energy into electrical energy.

Accordingly, it is an object of this invention to provide improved methods of fabricating improved semiconductor devices.

Another object of the invention is to provide improved methods of fabricating an improved photosensitive semiconductor device.

Still another object is to provide improved methods of fabricating improved radiation-resistant solar cells for the efficient conversion of incident solar energy into electrical energy.

But another object is to provide improved methods of fabricating improved gallium arsenide solar cells.

Yet another object is to provide improved methods of fabricating high efficiency gallium arsenide solar cells.

These and other objects are attained by an improved method of fabricating semiconductor junction devices which comprises an improved treatment of a given conductivity type semiconductive III–V compound wafer prior to the step of diffusing an opposite conductivity type modifier into the body to form a junction therein. According to one embodiment of the invention, a semiconductor junction device such as a solar cell is fabricated by treating a given conductivity type wafer of gallium arsenide in a solution of a strong oxidizing agent, and then diffusing an opposite conductivity type modifier into the wafer. A thin surface region of opposite conductivity type is formed on the wafer surface, and a rectifying barrier or p-n junction is formed at the interface between said opposite conductivity type surface region and the given conductivity type bulk of the wafer.

The invention will be described in greater detail by the following examples, considered in conjunction with the accompanying drawing, in which.

*Example I*

Figure 1:
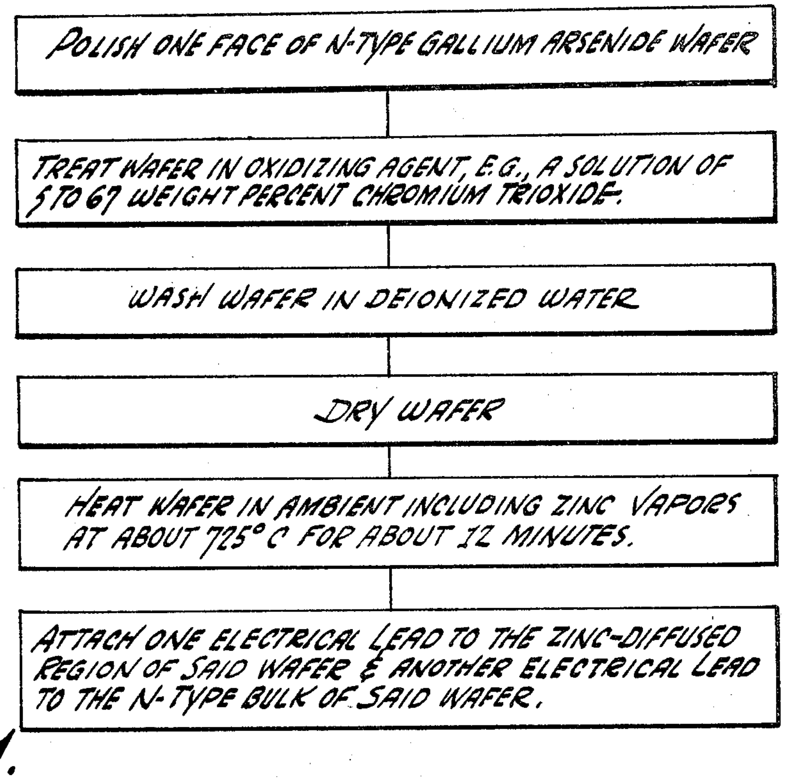
FIGURE 1 is a flow sheet of the method according to one embodiment of the invention.
Figure 2:
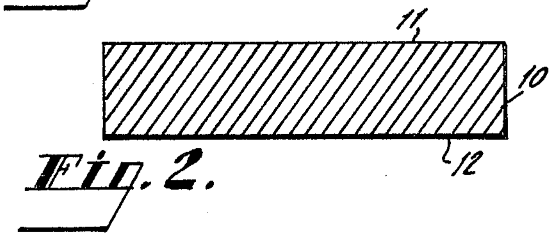
FIGURES 2–6 are cross-sectional views of a semiconductive III–V compound body during successive steps in the fabrication of a semiconductor device according to the invention.

A wafer 10 (FIGURE 2) of a given conductivity type crystalline semiconductive III–V compound is prepared with two opposing major faces 11 and 12. The exact size and shape of wafer 10 is not critical in the practice of the invention. In this example, wafer 10 is a slice of a monocrystalline ingot, is about 25 mils thick, and is about one inch in diameter. Wafer 10 may be either P-type or N-type, and consists of a semiconductive compound selected from the group consisting of the arsenides, antimonides, and phosphides of aluminum, indium, and gallium. In this example, wafer 10 consists of N-type gallium arsenide, and has a resistivity of about 0.1 to .01 ohm-cm. The wafer 10 is lapped and polished on one major face 11, then etched to remove the work-damaged surface portion of the wafer, and expose fresh clean undamaged surface. Various etchants may be utilized for this purpose. In this example, wafer 10 is etched for about five minutes in a mixture of 2 volumes concentrated hydrofluoric acid and 11 volumes concentrated hydrogen peroxide maintained at room temperature. After the lapping and polishing and etching steps, the thickness of wafer 10 is reduced to about 18 mils.

Figure 3:
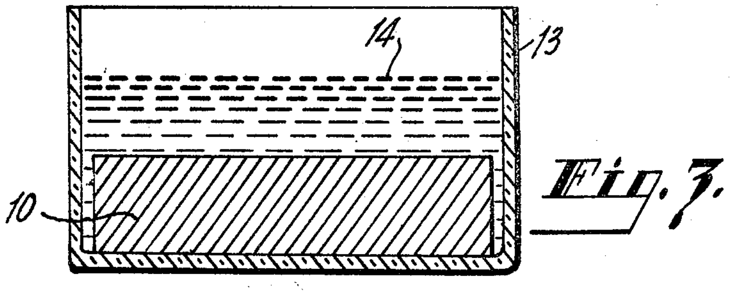

Wafer 10 is now treated in a solution of a strong oxidizing agent. The solvent of hte solution may, for example, be water. Conveniently, wafer 10 is immersed in a beaker 13 (FIGURE 3) containing a solution 14 of a strong oxidizing agent such as chromium trioxide, ammonium tetroxide, ceric sulfate, the permanganates of an alkali metal, the dichromates of an alkali metal, concentrated hydrogen peroxide, or the like. In this example, the oxidizing agent utilized in solution 14 is chromium trioxide. The exact concentration of chromium trioxide in solution 14 is not critical, and may vary from 5 to 67 percent by weight. When solution 14 is dilute, or is at room temperature, a prolonged period of immersion is required. Increasing the concentration of the oxidizing agent, or raising the temperature of solution 14 to about 80° to 100° C., shortens the required period of immersion for gallium arsenide wafer 10. In this example, solution 14 is a 30 weight percent aqueous solution of chromium trioxide, and is maintained at about a temperature of 80° to 100° C. Wafer 10 is immersed in solution 14 for a period of about one hour.

Wafer 10 is now thoroughly washed in deionized water, then dried. An impurity or conductivity modifier which induces conductivity of type opposite to that of the wafer is diffused into the surface of wafer 10 by techniques known to the semiconductor art so as to form thereon a thin surface region or layer 15 of type opposite that of the bulk of wafer 10, and a rectifying barrier or p-n junction 16 at the interface between the diffused surface region 15 and the bulk of the wafer. In this example, since the wafer utilized is N-type, the conductivity modifier diffused therein is an acceptor. Suitable acceptors for the III–V semiconductive compounds are zinc and cadmium. In this example, diffusion is accomplished by preheating wafer 10 in a furnace tube (not shown) about three minutes at about 725° C., preferably in an inert ambient such as argon or nitrogen. Zinc vapors are then introduced into the furnace tube, along with the inert ambient and heating of the wafer is continued for about 13 minutes at about 725° C. Wafer 10 is then cooled to room temperature in the inert ambient. Under these conditions, the p-n junction 16 is located about 1.5 microns below the surface of wafer 10.

The sheet resistance of the wafer surface, that is, of the surface of the diffused region 15, is now measured. Preferably, the resistivity should be in the range of about 25 to 60 ohms per square. If the sheet resistivity is too high, the diffusion step may be repeated to reduce the resistivity to the desired level.

Figure 5:
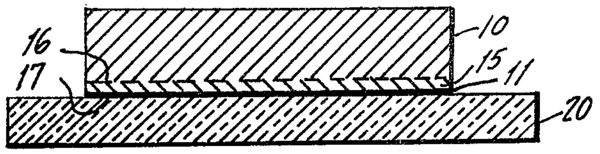

Wafer 10 is now mounted on a glass slide or plate 20 (FIGURE 5) with the polished face 11 down. Conveniently, wafer 10 is mounted on glass plate 20 by means of a wax layer 17 on the polished wafer face 11. The assemblage of wafer 10 and plate 20 is treated in a suitable etchant, such as the hydrofluoric acid–hydrogen peroxide mixture described above, so as to remove all of the zinc-diffused region 15 and p-n junction 16 except for the wax-protected portion on the polished wafer face 11.

Figure 6:
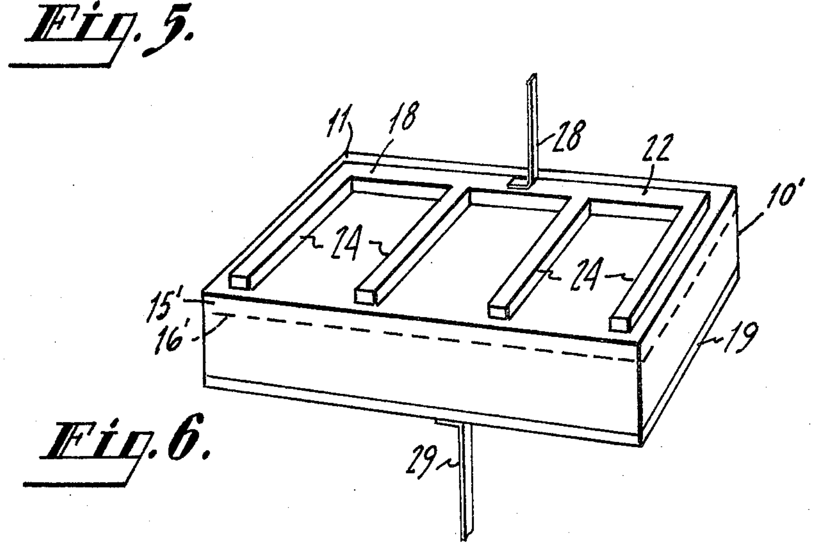

Wafer 10 is now removed from the glass plate 20; washed; dried; and cut to the desired size and shape. In this example, the cut wafer 10′ (FIGURE 6) thus formed is 1 cm. wide and 2 cm. long. On the side of wafer 10′ opposite polished face 11, a metallic layer 19 is deposited by any convenient method, for example, by evaporation. Metallic layer 19 serves as the electrode connection to the N-type bulk of gallium arsenide wafer 10′, and makes an ohmic connection or contact thereto. Suitable metals for this purpose include silver, chromium, lead, and mixtures of these metals. Another metallic electrode 18 is similarly formed on the polished face 11 of wafer 10′. Electrode 18 consists of a narrow buss bar 22 along the length of one edge of wafer face 11, and a plurality narrow fingers 24 extending from buss bar 22 across the width of wafer face 11. A nickel tab 29 is bonded to metallic layer 19 and another nickel tab 28 is bonded to buss bar 22 of electrode 18.

The device is completed by immersing it in a mild etchant such as 25 weight percent potassium hydroxide. This etchant does not appreciably attack the metallic electrodes or the electrical lead wires, but does remove a little of the zinc-diffused surface region 15′. The depth of the p-n junction 16′ is thus decreased to about 0.4 micron, and the efficiency of the device in converting solar energy into electrical energy is increased. The device is then washed in deionized water. If desired, a thin anti-reflection coating (not shown) such as silicon monoxide or the like, may be deposited on the surface of the zinc-diffused region 15′.

A 1 cm. by 2 cm. gallium arsenide solar cell fabricated as described above, exhibited an open circuit voltage of 0.9 volt; a short circuit current of 30 milliamperes; a maximum power voltage of 0.75 volt; and a maximum power current of 26 milliamperes.

Whereas comparable prior art gallium arsenide solar cells exhibited efficiencies of about 7 to 8 percent in the conversion of solar energy into electrical energy, devices fabricated as described in this example, exhibit efficiencies of about 10 to 12 percent, thus attaining the high efficiency level of silicon solar cells, while at the same time retaining the advantage of being highly resistant to deterioration by energetic radiation and energetic atomic particles.

Figure 7:
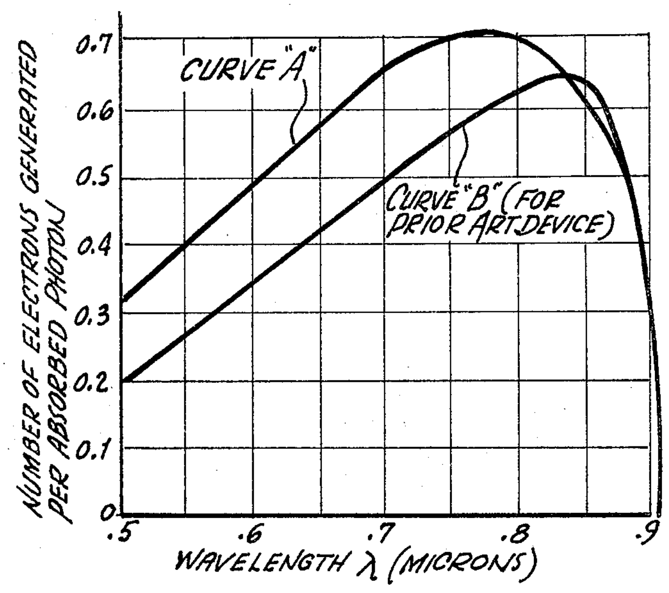
FIGURE 7 is a diagram plot showing the spectral response of a gallium arsenide solar cell fabricated according to the invention as compared to the response of a similar prior art cell.

Gallium arsenide cells, fabricated according to this embodiment, exhibited maximum spectral response to light having a wavelength of .75 to .79 micron, whereas prior art gallium arsenide solar cells have a peak spectral response to light having a wavelength of about .85 micron. The peak spectral response of the devices made according to this embodiment is thus shifted to the blue end of the spectrum, which is desirable since the photon energy of blue light is greater than the photon energy of red light. In FIGURE 7, curve "A" is a plot of the spectral response (the number of electrons generated in the semiconductor per absorbed photon for different wavelengths) of a gallium arsenide solar cell fabricated according to this embodiment. Curve "B" is a plot of the spectral response of a comparable prior art gallium arsenide solar cell. The shift of the peak spectral response toward the blue end of the spectrum for the device is apparent from the graph.

*Example II*

Whereas in the previous embodiment, the III–V compound semiconductive wafer was N-type, in this example the III–V semiconductive wafer is P-type. A wafer 10 (FIGURE 2) of P-type indium phosphide is prepared with two opposing major faces 11 and 12. Suitably, one major face 11 of wafer 10 is lapped, polished, and etched. The wafer 10 is then treated in a solution 14 (FIGURE 3) of a strong oxidizing agent, such as sodium permanganate, or permanganates of other alkali metals such as lithium and potassium. Alternatively, the dichromates of an alkali metal may be used. When hydrogen peroxide is utilized for the solution 14, a concentrated solution containing about 20 to 30 weight percent hydrogen peroxide is employed, and the solution is kept at room temperature. In this example, the oxidizing agent is potassium permanganate. The P-type indium phosphide wafer 10 is treated in a 1.5 weight percent potassium permanganate solution for about ½ to 5 minutes. Preferably, the potassium permanganate solution 14 is maintained at a temperature of about 30 to 75° C. during this step.

Figure 4:
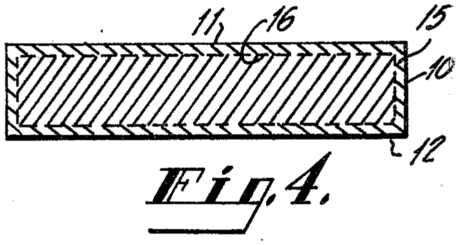

Wafer 10 is then washed, dried, and an opposite type conductivity modifier is diffused into the wafer. In this example, since the wafer is P-type, the conductivity modifier utilized is a donor. Suitable donors for the III–V semiconductive compounds include sulfur, selenium and tellurium. In this example, the indium phosphide wafer 10 is heated in an ambient including selenium vapors to form a thin surface region 15 (FIGURE 4) of N-type conductivity, and a p-n junction 16 at the interface between the diffused surface region 15 and the bulk of wafer 10. The remaining steps of waxing wafer 10 with polished face 11 down on a glass plate 20 (FIGURE 5), etching the wafer 10 to remove exposed portions of the diffused region 15, depositing metallic electrodes 18 and 19 (FIGURE 6) on opposing major wafer faces, and etching the device to decrease the depth of p-n junction 16, are similar to those described above in Example I.

While the exact reasons for the improved results obtained are not clearly understood at present, it is theorized that the treatment of a III–V wafer in a strong oxidizing solution may remove traces of contaminating substances of a reducing nature on the surface of the wafer. Another theory is that the treatment of the wafer in a solution of a strong oxidizing agent affects the density of surface states on the surface of the wafer, or reduces the surface recombination velocity of the III–V compound body, and thus decreases the number of charge carriers which recombine, hence increasing the charge carrier collector efficiency. Still another theory is that the conductivity of the wafer surface is changed, due to bending of the energy bands at the surface of the wafer. However, it will be understood that the invention may be practiced without reference to the particular theoretical explanation advanced for the improved results obtained.

While the above embodiments relate to photosensitive semiconductive devices, the method of the invention may also be utilized to fabricate other types of junction devices from III–V semiconductor compounds. For example, semiconductive devices such as conventional diodes and varactor diodes and tunnel diodes made from III–V compounds such as gallium arsenide appear to exhibit improved electrical characteristics, such as improved high frequency response, when the III–V compound wafer is treated in a strong oxidizing agent selected from the group consisting of chromium trioxide, osmium tetroxide, ceric sulfate, the permanganates of an alkali metal, the dichromates of an alkali metal, and concentrated hydrogen peroxide, prior to the step of diffusing an opposite conductivity type modifier into the wafer. III–V compound devices, such as laser diodes, may be fabricated utilizing the same technique.

It will be understood that the above examples are by way of illustration only, and not limitation. Other conductivity modifiers may be utilized. The semiconductive wafer may consist of mixtures or alloys of III–V compounds, such as gallium arsenide-gallium antimonide, or indium arsenide-gallium arsenide, instead of being a single III–V compound. Various other modifications may be made without departing from the spirit and scope of the invention as described in the specification and appended claims.

What is claimed is:

1. The method of fabricating a solar cell, comprising the steps of:

polishing one face of a given conductivity type gallium arsenide wafer;

treating said gallium arsenide wafer in a solution of a strong oxidizing agent selected from the group consisting of chromium trioxide, osmium tetroxide, ceric sulfate, the permanangates of an alkali metal, the dichromates of an alkali metal, and concentrated hydrogen peroxide for a period of time sufficient to shift the peak spectral response of the cell to light having a wavelength of .75 to .79 micron, diffusing an opposite conductivity type modifier into said one wafer face in an inert ambient to form a thin surface region of said opposite conductivity type and a rectifying barrier between said opposite type region and the bulk of said wafer; and, attaching one electrical lead to said opposite type region and another electrical lead to the given conductivity type bulk of said wafer.

2. The method of fabricating a solar cell, comprising the steps of:

polishing one face of an N-type gallium arsenide wafer;

treating said one face of said gallium arsenide wafer with a solution of a strong oxidizing agent selected from the group consisting of chromium trioxide, osmium tetroxide, ceric sulfate, the permanganates of an alkali metal, the dichromates of an alkali metal, and concentrated hydrogen peroxide for a period of time sufficient to shift the peak spectral response of the cell to light having a wavelength of .75 to .79 microns;

diffusing an acceptor modifier into said one wafer face in an inert ambient to form a thin surface region of P conductivity type and a rectifying barrier between said P-type region and the bulk of said wafer; and, attaching one electrical lead to said P-type diffused region and another electrical lead to the given type bulk of said wafer.

3. The method of fabricating a solar cell, comprising the steps of:

polishing one face of an N conductivity type gallium arsenide wafer;

treating said wafer in a solution of a strong oxidizing agent selected from the group consisting of chromium trioxide, osmium tetroxide, ceric sulfate, the permanganates of an alkali metal, the dichromates of an alkali metal, and concentrated hydrogen peroxide for a period of time sufficient to shift the peak spectral response of the cell to light having a wavelength of .75 to .79 micron; and, diffusing into said one wafer face in an inert ambient a modifier selected from the group consisting of zinc and cadmium to form a thin surface P-type region in said wafer, and a rectifying barrier between said P-type region and the bulk of said wafer.

References Cited by the Examiner

UNITED STATES PATENTS

| | | | |
|---|---|---|---|
| 2,766,508 | 10/1956 | Leloup | 29—25.3 X |
| 2,900,286 | 8/1959 | Goldstein | 148—187 |
| 2,948,642 | 8/1960 | MacDonald | 29—25.3 |
| 2,962,394 | 11/1960 | Andres. | |
| 3,147,152 | 9/1964 | Mendel. | |

JOHN F. CAMPBELL, *Primary Examiner.*

WHITMORE A. WILTZ, *Examiner.*

W. I. BROOKS, *Assistant Examiner.*